(12) United States Patent
Koc et al.

(10) Patent No.: US 11,545,609 B2
(45) Date of Patent: Jan. 3, 2023

(54) ELECTROMECHANICAL ACTUATOR, METHOD FOR ELECTRICAL EXCITATION OF AN ELECTROMECHANICAL ACTUATOR AND ULTRASONIC MOTOR

(71) Applicant: PHYSIK INSTRUMENTE (PI) GMBH & CO. KG, Karlsruhe (DE)

(72) Inventors: Burhanettin Koc, Ettlingen (DE); Bülent Delibas, Weingarten (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 187 days.

(21) Appl. No.: 16/772,853

(22) PCT Filed: Dec. 14, 2018

(86) PCT No.: PCT/EP2018/085057
§ 371 (c)(1),
(2) Date: Jun. 15, 2020

(87) PCT Pub. No.: WO2019/115805
PCT Pub. Date: Jun. 20, 2019

(65) Prior Publication Data
US 2020/0335687 A1    Oct. 22, 2020

(30) Foreign Application Priority Data

Dec. 15, 2017  (EP) .................................... 17207552

(51) Int. Cl.
*H01L 41/09*   (2006.01)
*H01L 41/187*   (2006.01)
*H02N 2/00*   (2006.01)

(52) U.S. Cl.
CPC ........ *H01L 41/0986* (2013.01); *H01L 41/187* (2013.01); *H02N 2/002* (2013.01); *H02N 2/0075* (2013.01)

(58) Field of Classification Search
CPC ... H01L 41/0986; H01L 41/187; H02N 2/002; H02N 2/0075
See application file for complete search history.

(56) References Cited

U.S. PATENT DOCUMENTS 8,928,205 B2 *    1/2015   Koc ....................... H02N 2/026
                                                                310/369
2009/0039736 A1    2/2009   Matsuo
(Continued)

OTHER PUBLICATIONS

Li Shiyang et al., "A face-shear mode single crystal ultrasonic motor", Applied Physics Letters, vol. 102, No. 18, May 6, 2013 (May 6, 2013), pp. 183512-1-183512-4, AIP Publishing LLC, US.
(Continued)

*Primary Examiner* — Emily P Pham
(74) *Attorney, Agent, or Firm* — The Juhasz Law Firm

(57) ABSTRACT

Disclosed is electromechanical actuator for ultrasonic motor in the shape of an n-sided regular polygon plate with n being equal to or greater than five. The polygon plate has two larger main surfaces and at least five smaller side surfaces connecting the main surfaces with each other. Two electrodes are arranged on one of the main surfaces and are electrically isolated from each other by a linear isolation area. One electrode is arranged on the other of the main surfaces. The polygon plate comprises an electromechanical material that undergoes a deformation when electric voltage is applied to the electrodes. The material of the electromechanical actuator comprises a single or polycrystalline piezoelectric ceramic with piezoelectric charge constant d31 differing from piezoelectric charge constant d32 both in sign and in value. The piezoelectric charge constants d31 and d32 define a first and second main deformation direction of the actuator perpendicular to each other. The orientation of the linear isolation area is parallel to either deformation direction.

16 Claims, 8 Drawing Sheets

(56) References Cited

U.S. PATENT DOCUMENTS

Figure 1:
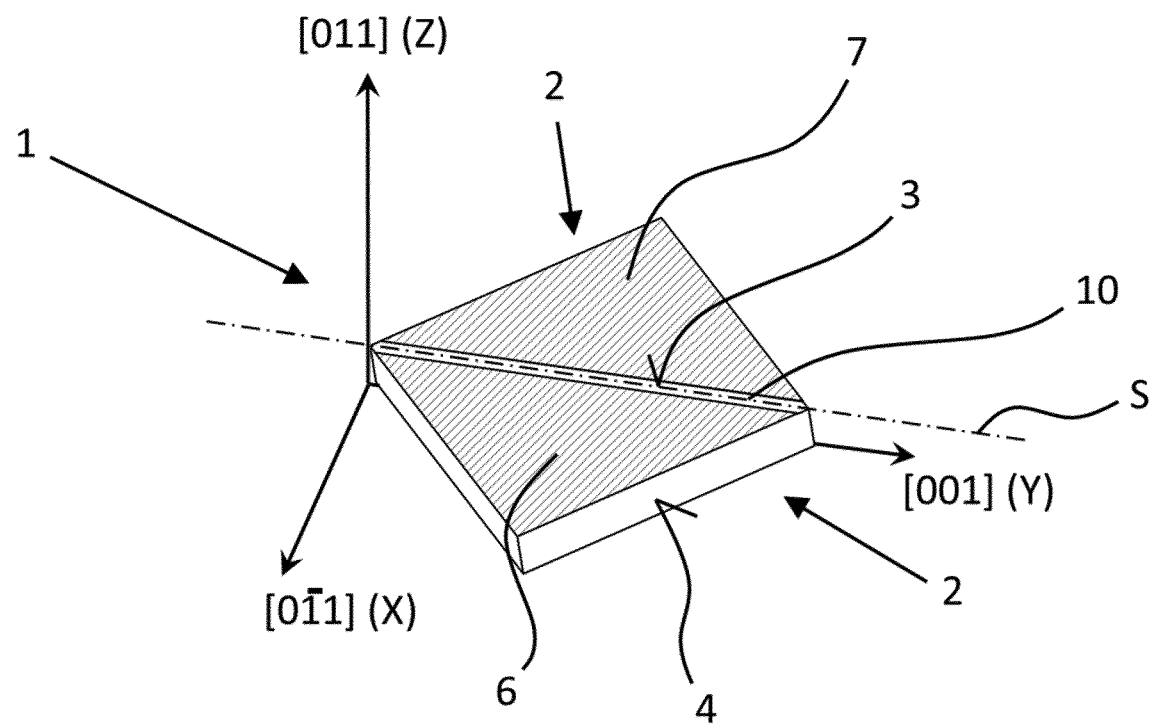

2016/0346556 A1* 12/2016 Slepian .................. H02N 2/181
2017/0059378 A1    3/2017 Nagareda et al.

OTHER PUBLICATIONS

International Search Report, PCT/EP2018/085057, dated Jun. 20, 2019, 3 pages (in English).
Written Opinion of the International Searching Authority, PCT/EP2018/085057, dated Jun. 20, 2019, 5 pages (in English).
Extended European Search Report dated Jul. 11, 2018, EP Application 17207552.5, Filed Dec. 15, 2017 (8 pages).

* cited by examiner

ELECTROMECHANICAL ACTUATOR, METHOD FOR ELECTRICAL EXCITATION OF AN ELECTROMECHANICAL ACTUATOR AND ULTRASONIC MOTOR

The invention is related to an electromechanical actuator, to a method for electrical excitation of an electromechanical actuator and to an ultrasonic motor.

Piezoelectric materials have the feature of converting electrical energy into mechanical energy and vice versa and thus have electromechanical properties. These materials are used in various sensor and actuator devices in many different technical fields. One of the well-established piezoelectric ceramic is lead zirconate titanate (abbreviation: PZT) based material, which has anisotropic properties and belongs to the hexagonal crystal symmetry class of 6 mm. Due to said crystal symmetry, PZT based ceramic materials have equal piezoelectric charge constants $d_{31}$ and $d_{32}$ in transverse directions. The subscript numbers 31 and 32 are defined as induced strain in direction 1 per unit applied electrical voltage in direction 3, or induced strain in direction 2 per unit applied electrical voltage in direction 3, respectively. Because the piezoelectric charge constants $d_{31}$ and $d_{32}$ for PZT based ceramic material in two orthogonal transverse directions are equal, only one parameter, for example $d_{31}$, is enough to represent piezoelectric charge constants of this material in transverse directions.

The signs of the piezoelectric charge constants $d_{31}$ and $d_{32}$ of PZT based ceramic materials are negative compared to the longitudinal or thickness mode piezoelectric charge constant $d_{33}$. Because of this property, a radial or a planar mode on a corresponding plate-shaped element is possible to be excited even if the excitation electrodes are not completely covering the main surfaces of the plate-shaped element.

Single crystal piezoelectric materials with orthorhombic mm2 symmetry class not only have larger electromechanically coupling with much larger (up to 10 times) piezoelectric charge constants; their piezoelectric charge constant in two transverse directions is also different both in sign and value. While the value of $d_{31}$ is negative and relatively small, the value of $d_{32}$ is positive and relatively large. As a result, unusual modes can be excited with single crystal piezoelectric materials which are not common for PZT based materials.

In the scientific article 'A face-shear mode single crystal ultrasonic motor' by Li et al., Applied Physics Letters 102, 183512 (2013), the authors describe an ultrasonic motor using phase-shear mode coupling of a quadratic plate made of PIN-PMN-PT with a symmetry of mm2 after poling. On one of the large or main plane surfaces of the quadratic plate, two excitation electrodes are arranged such that a line-shaped gap, which electrically isolates both excitation electrodes from each other, is oriented in the diagonal direction of the quadratic plate. The other of the large or main plane surfaces is fully covered with a single common electrode.

One corner of the quadratic plate, where the diagonally oriented line-shaped gap arranged between the two excitation electrodes is ending, is used as the contact point intended for an intermittent friction contact with an element to be driven. When one half of the quadratic plate is excited electrically by applying a sinusoidal signal between one of the excitation electrodes and the common electrode (while keeping the other excitation electrode floating), a phase-shear mode is excited due to the characteristics of the piezoelectric shear mode coupling coefficient d36 of single crystal material, and said phase-shear mode is used to drive the element to be driven in the desired motion direction.

In order to change the motion direction, the corresponding other excitation electrode needs to be electrically excited in an analogue matter. Although both excitation electrodes are identically shaped and even if the same electrical voltage or signal is applied, the generated motion of the element to be driven in the different directions is not identical due to the alignment of the excitation electrodes to the crystal orientation of the piezoelectric material of the quadratic plate. As a consequence, the performance of such kind of ultrasonic motor with respect to the generated speed and push pull force is direction dependent, which is the main drawback of this structure.

It is an object of the invention to provide an electromechanical actuator for an ultrasonic motor, an ultrasonic motor and a method for electrical excitation of an electromechanical actuator which allows an optimization of the functional performance respectively. Particularly, it is an object of the invention to provide an electromechanical actuator for an ultrasonic motor, an ultrasonic motor which can be electrically controlled respectively such that the performance as regards at least one of the generated speed of an element to be driven by the actuator and the push or pull force transferable to the element to be driven is independent from the driving direction and a method for electrical excitation of an electromechanical actuator by which the before-mentioned performance is independent from the driving direction.

The aforementioned objects are solved by the independent claims. Further embodiments are described in the respective subclaims.

The electromechanical actuator for an ultrasonic motor according to the invention comprises a plate which is formed of two main surfaces extending along each other and being oriented contrary to each other, and which is formed of at least three side surfaces extending transversely to the main surfaces and connecting the main surfaces with each other. The main surfaces may be larger surfaces compared to the area size of the side surfaces. Also, the main surfaces may be plane surfaces. The actuator according to the invention further comprises two electrodes which are equally shaped and arranged on a first of the main surfaces being electrically isolated from each other by an isolation area, and at least one electrode being arranged on a second of the main surfaces. The two electrodes which are arranged on the first main surface are arranged such that the electrodes are positioned symmetrically to each other with regard to a symmetry axis.

The plate-shaped actuator comprises an electromechanical material that undergoes a deformation when an electric voltage is applied to the electrodes arranged at the first of the main surfaces, wherein the material of the electromechanical actuator comprises a single crystalline piezoelectric ceramic with its piezoelectric charge constant $d_{31}$ differing from its piezoelectric charge constant $d_{32}$ both in sign as well as in value, with the piezoelectric charge constant $d_{31}$ defining a first main deformation direction of the actuator and with the piezoelectric charge constant $d_{32}$ defining a second main deformation direction of the actuator, and with the first main deformation and the second main deformation direction being arranged transversely and particularly perpendicular to each other, wherein the orientation of the symmetry axis is parallel to the first main deformation direction or to the second main deformation direction.

It is preferable that the isolation area extends entirely between the two electrodes, wherein it is more preferable that the isolation area is constituted as a straight isolation area with the symmetry axis being the centreline of the straight isolation area.

It is preferable that the actuator has the shape of an n-sided polygon plate with n being equal to or greater than three, and it is more preferable that the actuator has the shape of an n-sided regular polygon plate with n being equal to or greater than five.

It is preferable that on at least one of the side surfaces at least one friction device, most preferable a friction element, intended for a friction contact with an element to be driven or moved by the actuator is arranged. The friction device may comprise or consist of a friction element which is made of a homogenous material. However, it is not necessarily required that there is arranged a friction device or friction element, respectively, on the side surface of the polygon plate of the electromechanical element being intended for friction contact with an element to be driven. For example, the electromechanical actuator can have a contact surface section intended for frictional interaction with the element to be driven.

According to an embodiment of the actuator according to the invention, the electrodes which are disposed on the first main surface of the plate are disposed side by side on the first main surface. According to an embodiment of the actuator according to the invention, the two electrodes are electrically isolated from each other by an isolation area which extends between the electrodes entirely over the first main surface, wherein the symmetry axis is a centreline of the isolation area. The isolation area may be a longitudinal area which or the centreline of which extends straight over the first main surface and completely between the two electrodes. According to a further embodiment of the actuator according to the invention, the two electrodes are disposed symmetrically to each other with regard to the symmetry axis and overlap each other partially, wherein the electrodes may be isolated from each other by an intermediate isolation layer lying between the two electrodes in the region in which the electrodes are overlapping one another.

According to an excitation method of the afore described inventive electromechanical actuator, the two electrodes arranged on a first of the main surfaces are excitation electrodes and the one electrode arranged on the second main surface is a common electrode, where a first excitation voltage U1 is applied to one of the two excitation electrodes, and with the other of the two excitation electrodes kept floating, and with the common electrode being applied with a second excitation voltage U2 having a phase difference of 180° with respect to the first excitation voltage U1.

According to the invention, particularly a method for electrical excitation of an electromechanical actuator is provided which comprises: a plate which is formed of two main surfaces extending along each other and being oriented contrary to each other and which is formed of at least three side surfaces extending transversely to the main surfaces and connecting the main surfaces with each other, two equally shaped electrodes which are isolated from each other by an isolation area and arranged symmetrically to each other on a first of the main surfaces thereby defining a symmetry axis and at least one electrode arranged on the other of the main surfaces, wherein the plate comprises an electromechanical material that undergoes a deformation when an electric voltage is applied to electrodes arranged on different main surfaces, wherein the electromechanical material comprises a single polycrystalline piezoelectric ceramic which has a piezoelectric charge constant $d_{31}$ which differs from its piezoelectric charge constant $d_{32}$ both in sign and in value, with the piezoelectric charge constant $d_{31}$ defining a first main deformation direction of the actuator and with the piezoelectric charge constant $d_{32}$ defining a second main deformation direction of the actuator, and with the first main deformation and the second main deformation direction being arranged transversely and preferably perpendicular to each other, wherein the orientation of the symmetry axis is parallel to the first main deformation direction or to the second main deformation direction, wherein the method comprises the following steps: (a) applying a first excitation voltage U1 to a first of the two electrodes which are arranged on the first main surface, so as to use the first of the two electrodes as excitation electrode, wherein a second of the two electrodes arranged on the first main surface is kept floating, and (b) applying a second excitation voltage U2 having a phase difference of 180 degrees with respect to the first excitation voltage U1 to the electrode arranged on the second main surface.

According to an embodiment of the invention a resonance vibration mode, preferably the first resonance vibration mode, of the excited or driven part of the electromechanical actuator is excited by the combined application of the voltages U1 and U2 such that a perturbed first longitudinal mode is excited in the whole electromechanical actuator which results in an oblique motion of the friction device.

Herein with the expression "along" with regard to a reference direction or a reference axis, particularly in the context with the indications of a specific direction or specific axis, generally means that the specific direction or axis deviates locally at least with a maximal angle of 45 degrees and preferably at a maximal angle of 23 degrees from the reference direction or reference axis.

Herein with the expression "transversely" with regard to a reference direction or a reference axis, particularly in the context with the indications of a specific direction or specific axis, generally means that the respective direction or axis deviates locally with an angle which amounts between 45 degrees and 135 degrees and preferably with an angle which amounts between 67 degrees and 113 degrees from the reference direction or reference axis.

Further, herein generally the direction or centreline of a component, particularly of the isolation area or passage, is the direction of the connection line of the centroids of the smallest cross-sections of the component along a reference line and, respectively, the isolation area or passage. In case that this connection line is a curved line, a straight line is taken for which the integral of the distances to the connection line is a minimum.

Herein with the term "orientation" particularly in the context with a surface or a specific position of the surface generally means the direction of the local normal vector on the surface and on the surface at the specific position, respectively.

Figure 2:
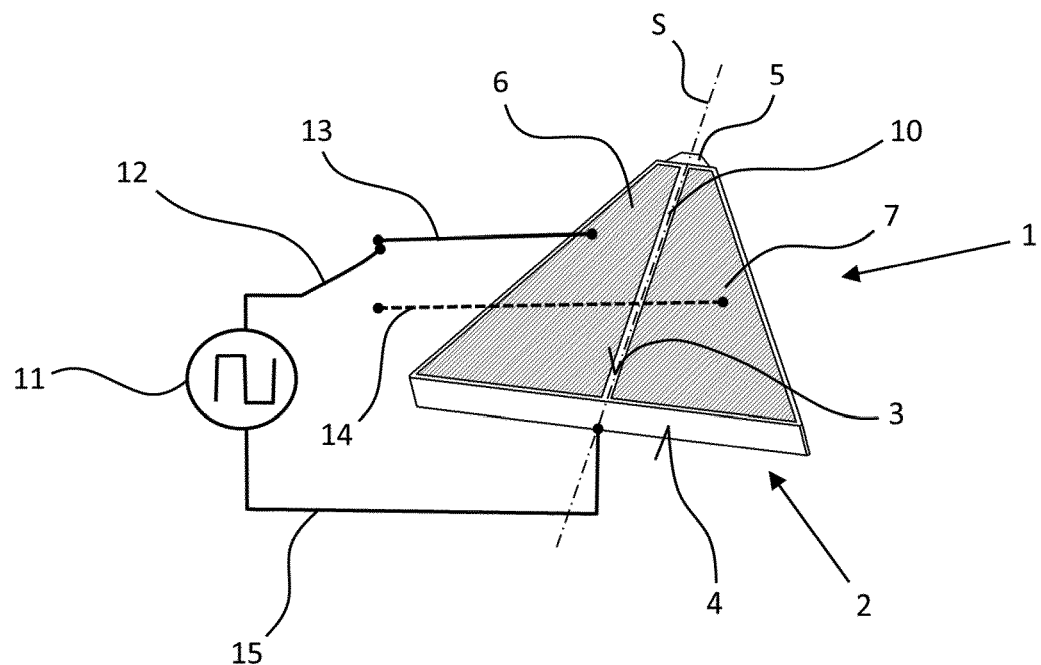
Figure 3:
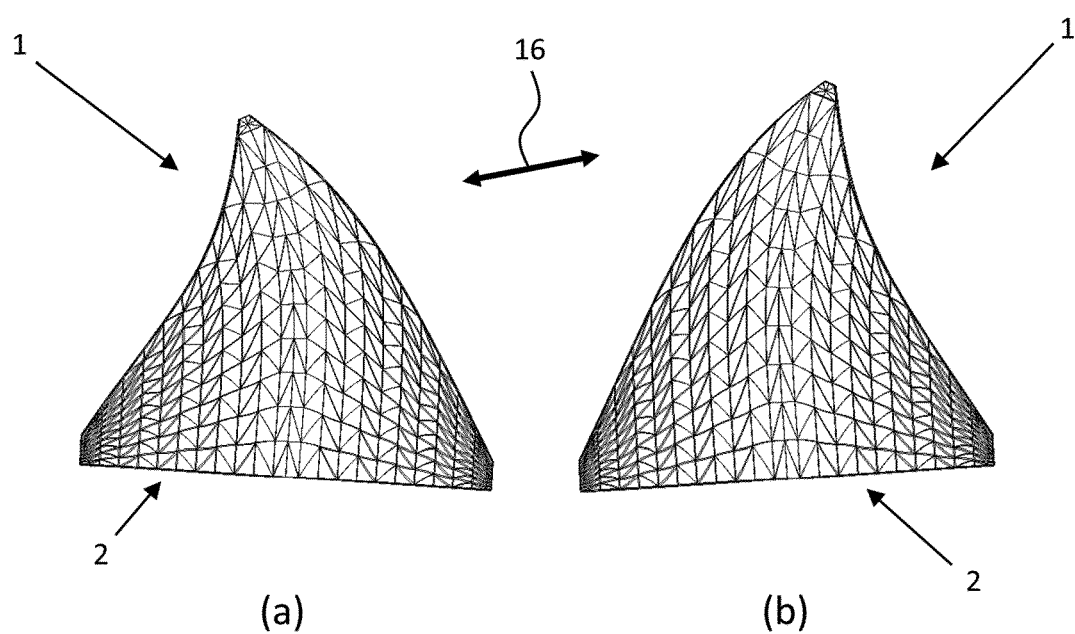
Figure 4:
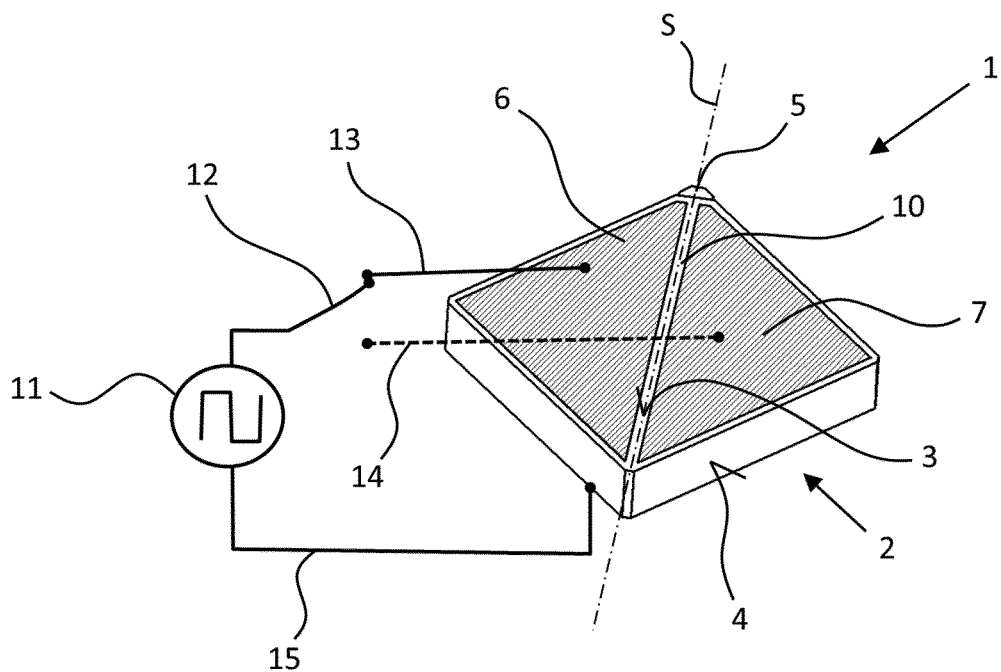
Figure 5:
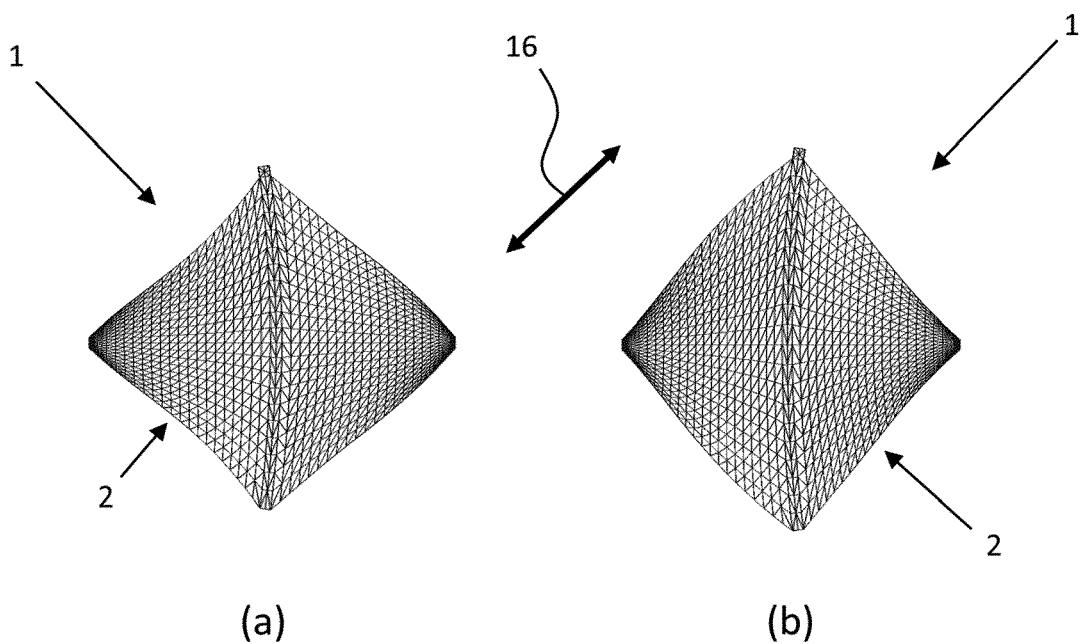
Figure 6:
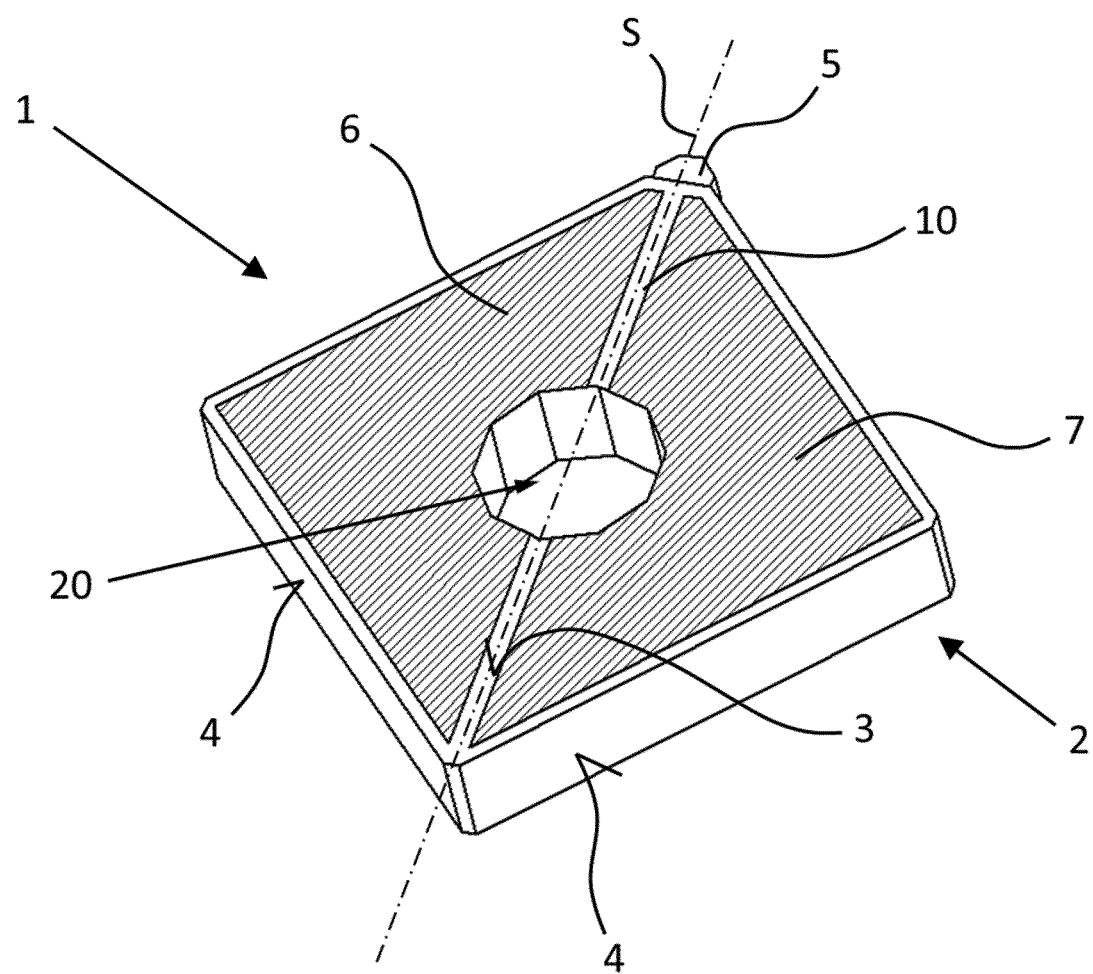
Figure 7:
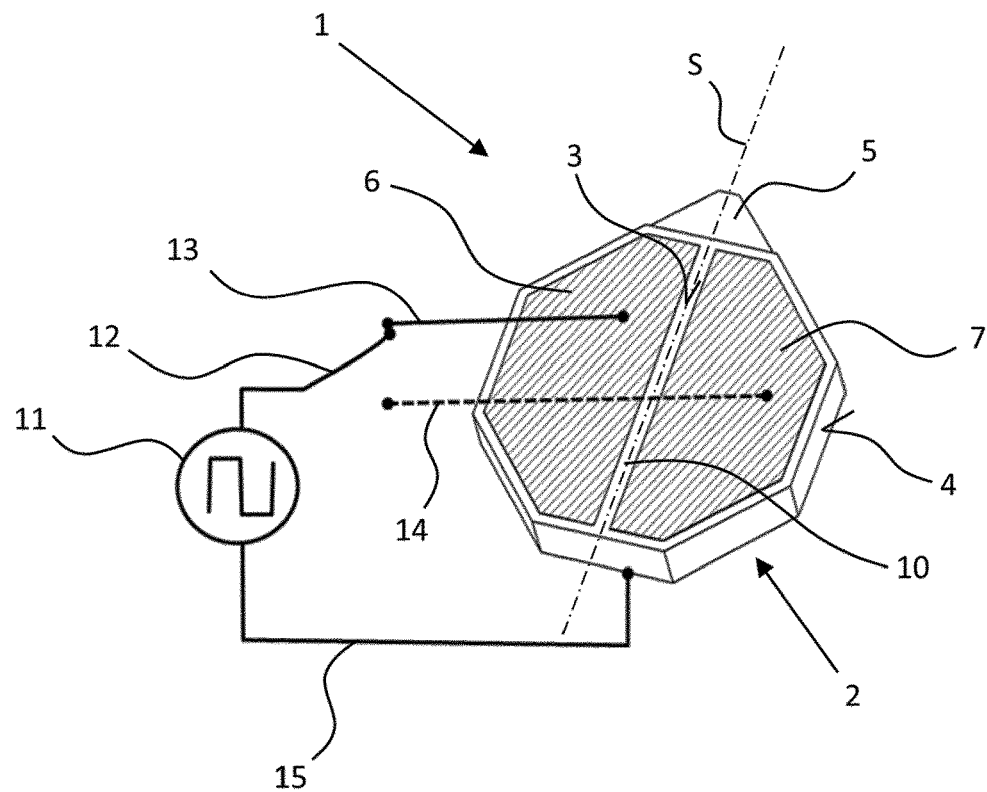
Figure 8:
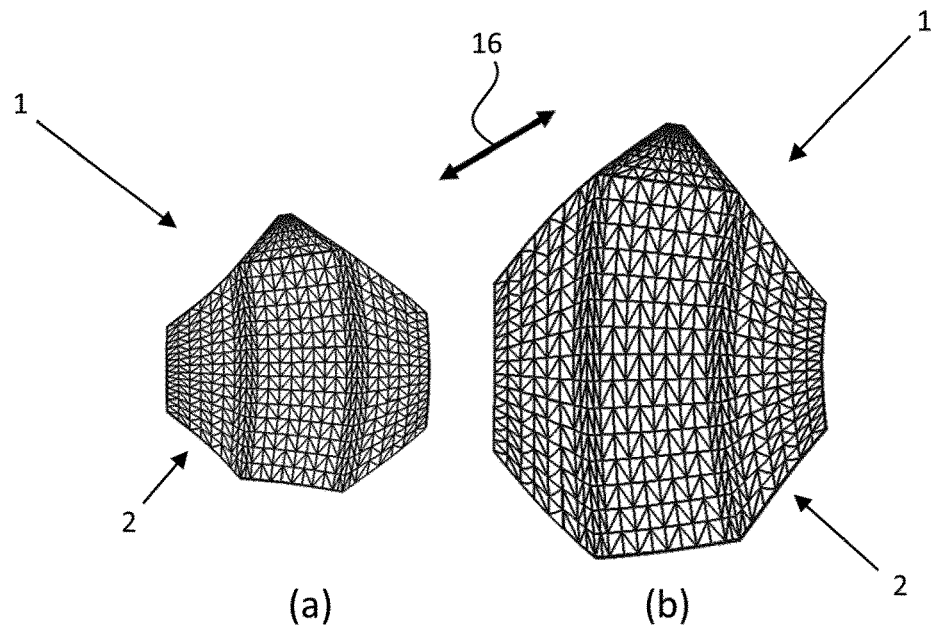
Figure 9:
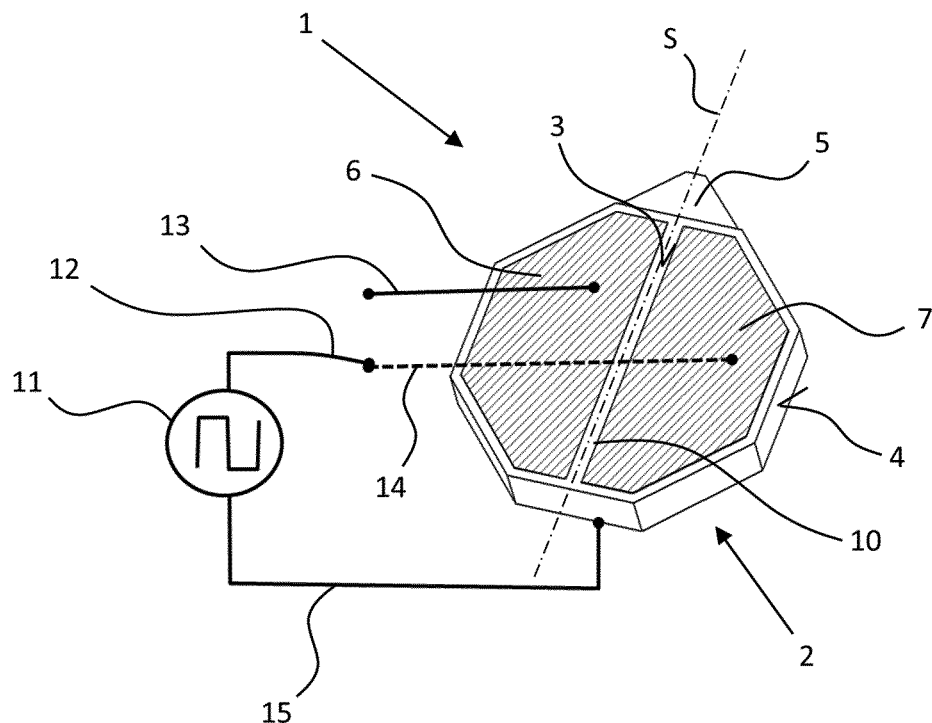
Figure 10:
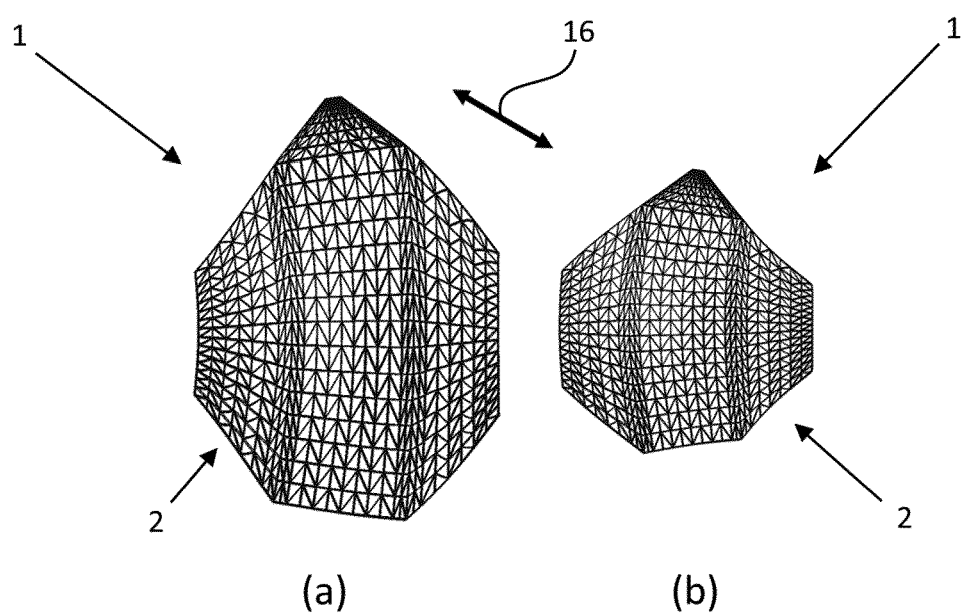
Figure 11:
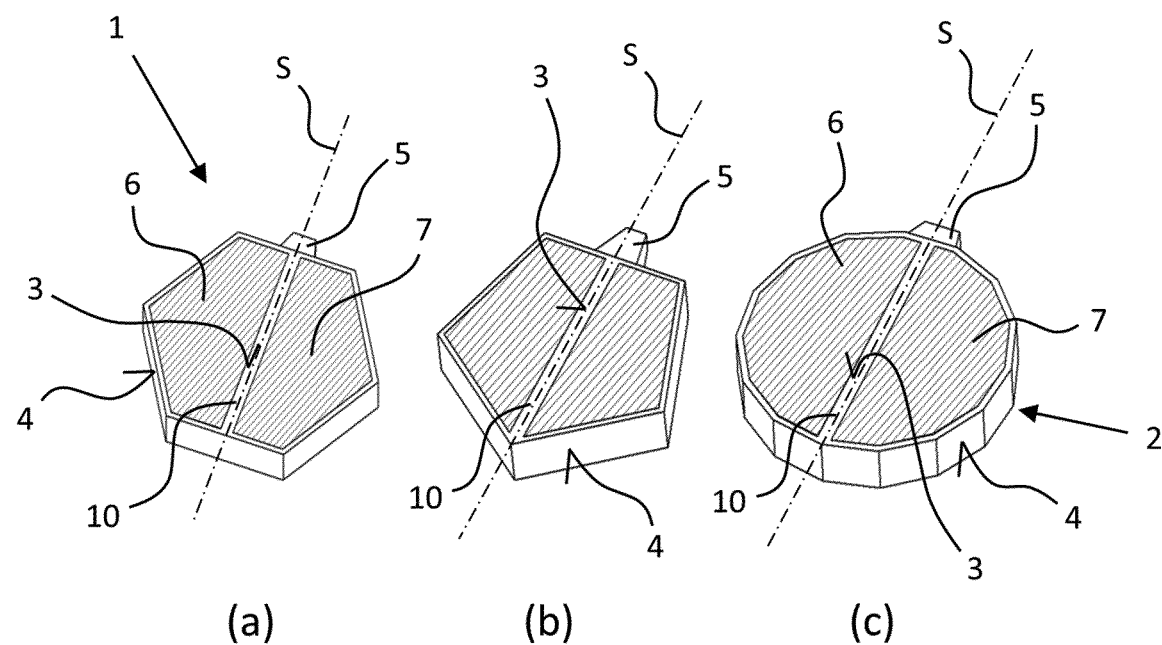
Figure 12:
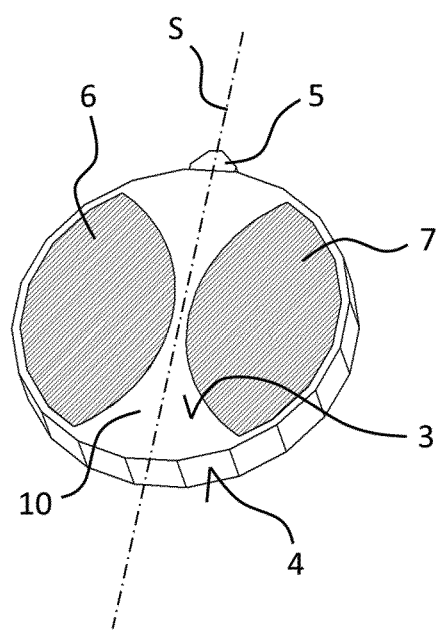
Figure 13:
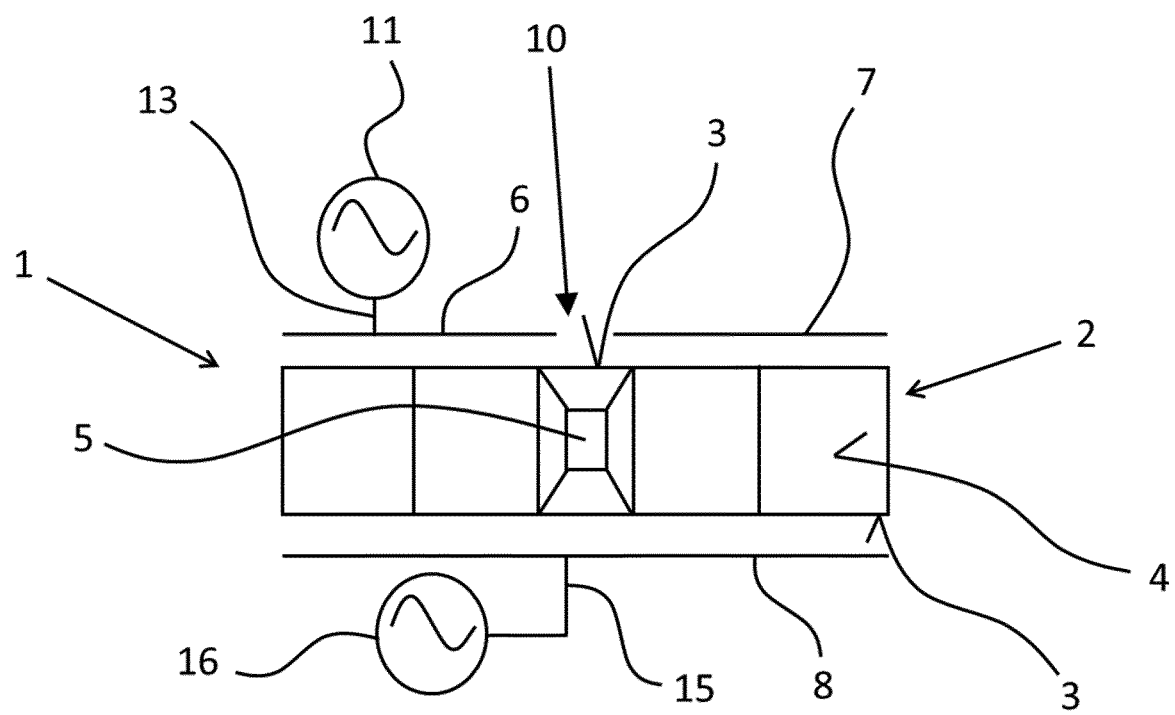

In the following, the invention is described by means of figures showing different embodiments of the invention. The figures show:

FIG. 1 an perspective view of an embodiment of an inventive electromechanical actuator in which crystal axes of a single crystalline piezoelectric ceramic material of the actuator and a symmetry axis S of the actuator is shown, FIG. 2 a further embodiment of an inventive electromechanical actuator having the shape of a four-sided polygon plate and a suitable electrical connection, FIGS. 3 (a) and (b) a FEM mesh showing the simulation results for both states of maximum deformation of the electrically excited electromechanical actuator according to FIG. 2, FIG. 4 a further embodiment of an inventive electromechanical actuator having the shape of a five-sided polygon plate and a suitable electrical connection, FIGS. 5 (a) and (b) a FEM mesh showing the simulation results for both states of maximum deformation of the electrically excited electromechanical actuator according to FIG. 4, FIG. 6 a modification of the electromechanical actuator according to FIG. 5, having a centre hole, FIG. 7 a further embodiment of an inventive electromechanical actuator having the shape of an eight-sided polygon plate and a suitable electrical connection, FIGS. 8 (a) and (b) a FEM mesh showing the simulation results for both states of maximum deformation of the electrically excited electromechanical actuator according to FIG. 7, FIG. 9: the electromechanical actuator according to FIG. 7 with a different electrical connection for a reverse driving direction compared to that shown in FIG. 7, FIGS. 10 (a) and (b) a FEM mesh showing the simulation results for both states of maximum deformation of the electrically excited electromechanical actuator according to FIG. 9, FIG. 11 (a)-(c) three further embodiments of an inventive electromechanical actuator each having the shape of a regular polygon, FIG. 12 a further embodiment of an inventive electromechanical actuator having the shape of a 20-sided regular polygon and FIG. 13 a block diagram showing a driving principle for an inventive electromechanical actuator.

FIG. 1 clarifies the orientation of the symmetry axis S with respect to the symmetrical arrangement of the two electrodes 6 and 7 arranged on the first of the two main surfaces 3 relative to the crystal axes of the single crystalline piezoelectric ceramic material of an inventive electromechanical actuator 1 in form of a regular 4-sided polygon plate 2. Only the first main surface 3 is visible in FIG. 1, with the two main surfaces 3 connected to each other by four equally sized side surfaces 4 extending perpendicular to the main surfaces 3.

On the visible, first main surface 3, two equally shaped and sized electrodes 6 and 7 in form of a triangle are arranged, where the expression "equally shaped and sized" means that their outlines are identical to each other.

The two electrodes 6 and 7 are electrically separated from each other by a straight isolation area 10 and have the same orientation as the symmetry axis S, with the symmetry axis S being the centreline of the straight isolation area 10. The orientation of the symmetry axis S is parallel to the Y-direction of the given coordinate system, with the Y-direction corresponding to the second main deformation direction of the electromechanical actuator defined by the piezoelectric charge constant $d_{32}$.

FIG. 2 shows a perspective view of an inventive electromechanical actuator 1 in the shape of a four-sided polygon plate 2 made from a single crystalline piezoelectric ceramic. Here, only the first of the two planar main surfaces 3 of the polygon plate 2 extending along each other is visible, whereas the second of the main surfaces 3 is on the rear side of the polygon plate 2 and thus not visible. The main surfaces 3 are oriented contrary to each other, i.e. the normal vector on the first main surface is oriented contrary or anti-parallel to the normal vector of the second main surface.

The two main surfaces 3 are connected to each other via four side surfaces 4 extending perpendicular to the main surfaces 3, where a friction device 5 constituted as a friction element is attached to that side surface 4 having the smallest area size, and with the three remaining side surfaces 4 having substantially the same area size. Thus, the polygon plate 2 together with the friction device 5 substantially resulting in a triangular shape.

On the visible main surface 3, two equally shaped and sized electrodes 6 and 7 realized by a corresponding metallization layer or portion are symmetrically arranged to each other. Said symmetrical arrangement of the electrodes 6 and 7 defines the symmetry axis S.

The electrodes 6 and 7 are electrically isolated from each other by a straight isolation area 10 extending entirely between the two electrodes 6 and 7. The electrodes 6 and 7 are symmetrically arranged about the symmetry axis S, and said symmetry axis S being the centreline of the straight isolation area 10.

On the non-visible main surface, only one electrode is arranged which is realized by a metallization layer deposited or attached to said main surface. The one-piece electrode covers nearly the whole area of the corresponding main surface except of a small peripheral zone near to the edges of the polygon plate 2.

The friction device 5 also has a polygon shape which is geometrically similar to the shape of the polygon plate 2, i.e. substantially a triangular shape, and the base of the friction device 5 is attached to one of those side surfaces 4 where the straight isolation area 10 ends. Here, the straight isolation area is arranged orthogonal to the side surface 4 the friction device 5 is attached to and also orthogonal to the parallel and oppositely arranged side surface. Moreover, the friction device 5 is symmetrically arranged to the symmetry axis S.

The slanted surfaces of the substantially triangular shaped friction device 5 are parallely arranged to the respective adjacent and slanted side surfaces of the polygon plate 2 such that the polygon plate 2 in combination with the friction device 5 attached to the smallest side surface 4 of the polygon plate 2 results in a substantially triangular shape.

The piezoelectric charge constant $d_{31}$ of the single crystalline piezoelectric ceramic material of the polygon plate 2 differs from its piezoelectric charge constant $d_{32}$ both in sign and in value. The piezoelectric charge constant $d_{31}$ defines a first main deformation direction of the electromechanical actuator 1, and the piezoelectric charge constant $d_{32}$ is defining a second main deformation direction of the electromechanical actuator 1, with the first main deformation and the second main deformation direction being arranged perpendicular to each other. The orientation of the symmetry axis S as well as of the straight isolation area 10 or its centreline, respectively, is parallel to the first main deformation direction or to the second main deformation direction.

An AC voltage source 11 is connected by a lead wire 13 with the electrode 6, said electrode 6 thus constituting an excitation electrode, where the switch 12 according to FIG. 2 is closed in order to realize an electrical connection between the AC voltage source 11 and the lead wire 13 or the excitation electrode 6, respectively. The other pole of the AC voltage source 11 is connected via a lead wire 15 with the non-visible electrode arranged on the non-visible main surface 3, said electrode constituting a common electrode.

The dashed line in FIG. 2 shows a further lead wire 14 that is intended for connecting the other electrode 7 via the switch 12 with the AC voltage source 11 in order to generate a reverse motion of the electromechanical actuator (see FIGS. 7 to 10), and thus making electrode 7 an excitation electrode.

FIG. 3 illustrates the two states of maximum deformation of the polygon plate 2 of the inventive electromechanical actuator 1 according to FIG. 2 when an AC voltage is applied to it with the electrical connection shown in FIG. 2. FIG. 3 (a) shows the mesh model of a FEM calculation for one of the maximum deformations of the polygonal plate 2 of the electromechanical actuator 1 where the friction element is in the most rearward position in relation to its intended drive motion (said drive motion being characterized by the double arrow 16 in FIG. 3). In contrast thereto, FIG. 3 (b) shows the mesh model of a FEM calculation for the reverse or opposite maximum deformation of the polygonal plate 2 of the electromechanical actuator 1 where the friction element is in the most forward position related to its intended drive motion according to double arrow 16. In other words, the deformations created within the polygonal plate of the electromechanical actuator due to the corresponding electrical excitation according to FIG. 2 are suited for driving an element to be driven (by friction contact with the friction device) to the right with respect to FIG. 3.

FIG. 4 shows a further embodiment of an inventive electromechanical actuator 1 having the shape of a five-sided polygon 2 with a friction device 5 consisting of a friction element arranged at the smallest of the five side surfaces 4. Two equally sized and shaped electrodes 6 and 7 are symmetrically arranged to each other on the first main surface 3, electrically isolated from each other by a straight isolation area 10 extending entirely between the electrodes 6 and 7. The symmetry axis S runs parallely to said straight isolation area 10 being its centreline, and the friction device 5 is symmetrically arranged with respect to the symmetry axis S.

The friction device 5 has the shape of a four-sided polygon plate, with its longest side surface being attached to the shortest or smallest side surface 4 of the polygon plate 2, such that the combination of the polygon plate 2 and the friction device 5 results in a substantially quadratic shape.

FIG. 4 also shows a suitable electrical connection for the corresponding electromechanical actuator 1, which is identically realized as compared to the electrical connection shown in FIG. 2, whereas FIGS. 5 (a) and (b) show the two states of maximum deformation of the polygon plate 2 of FIG. 4 when—during operation—an AC voltage is applied to it with such an electrical connection. The electromechanical actuator is actuated such that it periodically changes its shape between said two states of maximum deformation, thus resulting in a movement of the friction device 5 attached to it along the trajectory illustrated by double arrow 16, said movement of the friction device 5 being suitable for driving of an element to be driven.

FIG. 6 shows an embodiment of an inventive electromechanical actuator similar to that shown in FIG. 4, with the only difference being a centrally arranged and substantially circular shaped opening 20. Said opening 20 or hole is intended for holding the electromechanical actuator as the deformation during operation at the position of the opening 20 is small compared to the deformation at the side surface where the friction device is attached to. Thus, holding the actuator at said position has no or little negative impact on the intended deformation or vibration of the electromechanical actuator and thus on the intended motion or trajectory of the friction device. Instead of an opening, it is also possible to have a recessed portion within the electromechanical actuator to fulfil the aforementioned requirements.

FIGS. 7 and 9 show a further embodiment of an inventive electromechanical actuator 1 having the shape of an eight-sided polygon plate 2 and a possible electrical connection for actuating or driving the actuator. While FIG. 7 shows the situation where the lead wire 13 is connecting the electrode 6 (thus resulting in said electrode being an excitation electrode) arranged on the first main surface 3 with the AC voltage source and with the lead wire 15 connecting the non-visible electrode (said electrode building up a common electrode then) arranged on the second main surface with the AC voltage source, FIG. 9 shows the situation where the lead wire 14 is connecting the other (excitation) electrode 7 arranged on the first main surface 3 and with the lead wire 15 connecting the (common) electrode arranged on the non-visible second main surface with the AC voltage source.

The corresponding FIGS. 8 (a) and (b) and 10 (a) and (b) show for said different electrical connections the respective states of maximum deformation of the actuator in operation calculated by FEM simulation. It can be seen that the double arrow 16 in FIG. 8 has a transverse orientation compared to the double arrow 16 in FIG. 10, where said double arrow 16 in each case represents the trajectory of the friction device, and where the corresponding movement of the friction device according to FIG. 8 is suitable to drive an element to be driven to the right direction with respect to FIG. 8, and with the movement of the friction device according to FIG. 10 being suitable to drive an element to be driven in the left direction with respect to FIG. 10.

As can be gathered from the FEM simulations according to FIGS. 8 (a) and (b) and FIGS. 10 (a) and (b), the maximum deformations achievable with the electromechanical actuator according to the invention are substantially the same for the reverse driving directions, i.e. the driving directions with are directed contrary to each other. Therefore, the effectivity of the actuator according to the invention is identical in both driving directions which are directed contrary to each other.

FIGS. 11 (a) to (c) shows three further possible embodiments of an inventive electromechanical actuator 1. FIG. 11 (a) shows an electromechanical actuator 1 with a six-sided regular polygon plate 2 having two equally shaped and sized electrodes 6 and 7 on the first main surface 3, being electrically isolated from each other by a straight isolation area 10, and with the electrodes 6 and 7 being symmetrically arranged about the symmetry axis S being the centreline of the straight isolation area 10. One single-piece electrode (not visible) is arranged at the non-visible second main surface. A friction device 5 constituted as a friction element is attached to one of those side surfaces 4 of the six-sided polygon plate where the linear isolation area 10 ends, with the linear isolation area 10 and the symmetry axis S being arranged perpendicular to said side surface, and with the friction device 5 being arranged symmetrically to the symmetry axis S.

FIG. 11 (b) shows an electromechanical actuator 1 with a five-sided regular polygon plate 2 having two equally shaped and sized electrodes 6 and 7 arranged on the first main surface 3, being electrically isolated from each other by a straight isolation area 10, and with the electrodes 6 and 7 being symmetrically arranged about the symmetry axis S constituting the centreline of the straight isolation area 10. One single-piece electrode (not visible) is arranged at the non-visible second main surface. A friction device 5 constituted as a friction element is attached to that side surface 4 of the five-sided polygon plate where the straight isolation area 10 ends, with the straight isolation area 10 and the symmetry axis S being arranged perpendicular to said side surface, and with the friction device 5 being arranged symmetrically to the symmetry axis S.

FIG. 11 (c) shows an electromechanical actuator 1 with a fifteen-sided regular polygon plate 2 having two equally shaped and sized electrodes 6 and 7 arranged on the first main surface 3, being electrically isolated from each other by a straight isolation area 10, and with the electrodes 6 and 7 being symmetrically arranged about the symmetry axis S. One single-piece electrode (not visible) is arranged at the non-visible second main surface. A friction device 5 constituted as a friction element is attached to one of those side surfaces 4 of the fifteen-sided polygon plate where the linear isolation area 10 ends, with the linear isolation area 10 and the symmetry axis being arranged perpendicular to said side surface, and with the friction device 5 being arranged symmetrically to the symmetry axis S.

FIG. 12 shows a further embodiment of an inventive electromechanical actuator 1 being constituted as a twenty-sided regular polygon plate 2, thus having nearly a circular shape. On one of the twenty side-surfaces 4 of the actuator, a friction device 5 constituted as a friction element is arranged. Two substantially elliptical shaped electrodes 6 and 7 are symmetrically arranged on the first and visible main surface 3, whereas a one-piece electrode is arranged on the non-visible second main surface covering it nearly completely. FIG. 12 also shows the symmetry axis S related to which the electrodes 6 and 7 are symmetrically arranged. Between the electrodes 6 and 7, the isolation area 10 is placed, where the isolation area 10 is also symmetrically arranged with respect to the symmetry axis S. In addition, the friction device 5 is arranged symmetrically related to the symmetry axis S.

FIG. 13 shows a block diagram for a possible electrical connection or a driving principle, respectively, of an inventive electromechanical actuator according to FIG. 11 (a). The electromechanical actuator 1 has two electrodes 6 and 7 on its first main surface 3 with said electrodes 6 and 7 being separated or electrically isolated from each other by a straight isolation area 10. The electrode 6 is connected via lead wire 13 with a first AC voltage source 11 (thus resulting in electrode 6 being an excitation electrode) supplying a first excitation voltage U1, whereas the electrode 7 is kept floating.

A single electrode 8 is arranged on the second main surface 3, said electrode 8 constituting a common electrode. The common electrode 8 is connected via lead wire 15 with a second AC voltage source 16 supplying a second excitation voltage U2. The second excitation voltage U2 has a phase difference of 180° with respect to the first excitation voltage U1.

The method according to the invention comprises the following steps: (a) applying a first excitation voltage U1 to a first of two electrodes 6, 7 which are arranged on the first main surface 3, so as to use the first of the two electrodes 6 and 7 as excitation electrode, wherein a second of the two electrodes arranged on the first main surface 3 is kept floating, (b) applying a second excitation voltage U2 having a phase difference of 180° with respect to the first excitation voltage U1 to the electrode 8 arranged on the second main surface 3, so as to use the electrode 8 as a common electrode.

It is to be noted that the electromechanical actuator according to the invention may also have more than one electrode and preferably two equally sized and shaped electrodes arranged on the second main surface and being in registration with the two excitation electrodes arranged on the first main surface.

The working or driving principle of the inventive electromechanical actuator is as follows: when one half of the single crystalline piezoelectric ceramic of the plate of the electromechanical actuator is electrically excited, the sign difference between the piezoelectric charge constants $d_{31}$ and $d_{32}$ makes the excited section of the plate to move at a larger magnitude of displacement compared to the non-excited half of the plate. As a result, the excited section or excited half, respectively, makes a motion that is similar to a motion corresponding to a combined excitation of the first bending and the first longitudinal mode. However, the generated mode is not a coupled one of two orthogonal vibration modes, but it is a unique and perturbed non-symmetric single longitudinal mode.

With the electromechanical actuator according to the invention, a simplified bulk structure can be realized, and the driving voltage of a corresponding ultrasonic motor—even with the bulk structure of the piezoelectric ceramic—can be reduced to a range between 10 and 20 Volt, which is a prerequisite for some industries like medical applications. 'Bulk structure' in the aforementioned means the absence of a multilayer structure where electrodes are not only arranged at the surfaces of the electromechanical actuator, but with an additional multitude of electrode layers inside the piezoelectric ceramic.

Furthermore, the performance of an ultrasonic motor with the inventive electromechanical actuator can be improved compared to an ultrasonic motor having a poly-crystalline PZT-based actuator due to the higher maximum power density and their higher figure of merits of single crystalline piezoelectric ceramics.

A further advantage of the inventive electromechanical actuator is that the vibration modes of single crystal materials have lower operating frequencies than the vibration modes of PZT materials. Thus, miniaturized ultrasonic motors can be operated with moderate operating frequencies (i.e. <500 kHz).

Finally, with the inventive electromechanical actuator no geometric aspect ratios have to be met in order to generate useful modes. Thus, there is no need for tight manufacturing tolerances as regards the geometry of the polygon plate.

The invention claimed is:

1. An electromechanical actuator for an ultrasonic motor, the electromechanical actuator comprising:
   a plate which is formed of two main surfaces extending along each other and being oriented contrary to each other, the plate having side surfaces extending transversely to the two main surfaces and connecting the two main surfaces with each other;
   two electrodes which are isolated from each other by an isolation area and which are arranged symmetrically to each other on a first of the two main surfaces thereby defining a symmetry axis; and
   at least one electrode arranged on a second of the two main surfaces, the plate comprising an electromechanical material that undergoes a deformation under the influence of an electric voltage;
   wherein the material of the electromechanical actuator comprises a single crystalline piezoelectric ceramic with its piezoelectric charge constant d31 differing from its piezoelectric charge constant d32 both in sign and in value, with the piezoelectric charge constant d31 defining a first main deformation direction of the electromechanical actuator and with the piezoelectric charge constant d32 defining a second main deformation direction of the electromechanical actuator, and with the first main deformation and the second main deformation direction being arranged transversely to each other, wherein an orientation of the symmetry axis is parallel to the first main deformation direction or to the second main deformation direction.

2. The electromechanical actuator according to claim 1, wherein the electromechanical material of the plate that undergoes a deformation:
   receives a first excitation voltage at a first of the two electrodes which are arranged on the first main surface so as to use the first of the two electrodes as an excitation electrode, wherein a second of the two electrodes arranged on the first main surface is kept floating; and
   receives a second excitation voltage having a phase difference of 180° with respect to the first excitation voltage at the electrode arranged on the second main surface, so as to use the electrode arranged on the second main surface as a common electrode.

3. The electromechanical actuator according to claim 1, wherein the isolation area extends entirely between the two electrodes.

4. The electromechanical actuator according to claim 3, wherein the two main surfaces have a shape of an n-sided polygon plate with n being equal to or greater than three.

5. The electromechanical actuator according to claim 3, wherein the two main surfaces have a shape of an n-sided regular polygon plate with n being equal to or greater than five.

6. The electromechanical actuator according to claim 3, wherein the two main surfaces extend parallel to each other.

7. The electromechanical actuator according to claim 3, wherein the electromechanical actuator comprises at least one friction device which is arranged on at least one of the side surfaces wherein the friction device comprises a friction surface for contacting an element to be driven.

8. The electromechanical actuator according to claim 7, wherein the friction device comprises a friction element which is made of a homogenous material.

9. An ultrasonic motor, comprising the electromechanical actuator according to claim 3 and an element to be driven, wherein the electromechanical actuator comprises a contact surface section which interacts with the element to be driven for moving the same relative to the electromechanical actuator.

10. The electromechanical actuator according to claim 1, wherein the two main surfaces have a shape of an n-sided polygon plate with n being equal to or greater than three.

11. The electromechanical actuator according to claim 1, wherein the two main surfaces have a shape of an n-sided regular polygon plate with n being equal to or greater than five.

12. The electromechanical actuator according to claim 1, wherein the two main surfaces extend parallel to each other.

13. The electromechanical actuator according to claim 1, wherein the electromechanical actuator comprises at least one friction device which is arranged on at least one of the side surfaces wherein the friction device comprises a friction surface for contacting an element to be driven.

14. The electromechanical actuator according to claim 13, wherein the friction device comprises a friction element which is made of a homogenous material.

15. An ultrasonic motor, comprising the electromechanical actuator according to claim 1 and an element to be driven, wherein the electromechanical actuator comprises a contact surface section which interacts with the element to be driven for moving the same relative to the electromechanical actuator.

16. A method for electrical excitation of an electromechanical actuator, comprising:
   providing the electromechanical actuator comprising a plate which is formed of two main surfaces extending along each other and being oriented contrary to each other and which is formed of side surfaces extending transversely to the two main surfaces and connecting the two main surfaces with each other, two electrodes which are isolated from each other by an isolation area and which are arranged symmetrically to each other on a first of the two main surfaces thereby defining a symmetry axis, and at least one electrode arranged on a second of the two main surfaces, wherein the plate comprises an electromechanical material that undergoes a deformation under the influence of an electric voltage, wherein the material of the electromechanical actuator comprises a single crystalline piezoelectric ceramic with its piezoelectric charge constant d31 differing from its piezoelectric charge constant d32 both in sign and in value, with the piezoelectric charge constant d31 defining a first main deformation direction of the electromechanical actuator and with the piezoelectric charge constant d32 defining a second main deformation direction of the electromechanical actuator, and with the first main deformation and the second main deformation direction being arranged transversely to each other, wherein an orientation of the symmetry axis is parallel to the first main deformation direction or to the second main deformation direction;
   applying a first excitation voltage to a first of the two electrodes which are arranged on the first main surface so as to use the first of the two electrodes as an excitation electrode, wherein a second of the two electrodes arranged on the first main surface is kept floating; and
   applying a second excitation voltage having a phase difference of 180° with respect to the first excitation voltage to the electrode arranged on the second main surface, so as to use the electrode arranged on the second main surface as a common electrode.

* * * * *